United States Patent
Hirose et al.

(10) Patent No.: US 9,276,326 B2
(45) Date of Patent: Mar. 1, 2016

(54) ELECTROMAGNETIC WAVE ABSORBER

(71) Applicant: KABUSHIKI KAISHA RIKEN, Tokyo (JP)

(72) Inventors: Keita Hirose, Saitama (JP); Takashi Ono, Saitama (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 262 days.

(21) Appl. No.: 13/937,642

(22) Filed: Jul. 9, 2013

(65) Prior Publication Data

US 2014/0132439 A1 May 15, 2014

(30) Foreign Application Priority Data

Jul. 10, 2012 (JP) .................. 2012-155085

(51) Int. Cl.
*H01Q 17/00* (2006.01)
*H05K 9/00* (2006.01)

(52) U.S. Cl.
CPC ............. *H01Q 17/00* (2013.01); *H05K 9/0052* (2013.01)

(58) Field of Classification Search
CPC ...................................... H01Q 17/00
USPC .................................. 342/1, 2, 3, 4
See application file for complete search history.

(56) References Cited

U.S. PATENT DOCUMENTS

| | | | | |
|---|---|---|---|---|
| 2003/0096104 | A1* | 5/2003 | Tobita et al. | 428/332 |
| 2009/0135042 | A1* | 5/2009 | Umishita et al. | 342/1 |
| 2011/0124483 | A1* | 5/2011 | Shah et al. | 501/32 |
| 2012/0025111 | A1* | 2/2012 | Bryant et al. | 250/515.1 |

FOREIGN PATENT DOCUMENTS

| | | | | |
|---|---|---|---|---|
| JP | 07-193388 | A | | 7/1995 |
| JP | 07193388 | A * | 7/1995 | .............. G01R 1/18 |
| JP | 2000-299591 | A | | 10/2000 |
| JP | 2002273741 | A * | 9/2002 | ............ B82Y 30/00 |
| JP | 2003-158395 | A | | 5/2003 |
| JP | 2003158395 | A * | 5/2003 | |
| JP | 2005-231931 | A | | 9/2005 |
| JP | 2005231931 | A * | 9/2005 | .............. C04B 14/02 |
| JP | 2005-311088 | A | | 11/2005 |
| JP | 4697829 | B2 | | 3/2011 |
| JP | 2012-087041 | A | | 5/2012 |

OTHER PUBLICATIONS

English Machine Translation of JP 07193388 A.*
English Machine Translation of JP 2002273741 A.*
English Machine Translation of JP 2005231931 A.*
Chinese Office action for Application No. 201310288188.X dated Oct. 31, 2014.
Korean Office action for Application No. 10-2013-0080311 dated Dec. 12, 2014.
Office Action Issued in corresponding Japanese Patent Application No. 2012-155085 dated Feb. 13, 2014.

* cited by examiner

*Primary Examiner* — Peter Bythrow
*Assistant Examiner* — Helena Seraydaryan
(74) *Attorney, Agent, or Firm* — Pearne & Gordon LLP

(57) ABSTRACT

An electromagnetic wave absorber contains cement and carbon nanotubes and has an absolute value of a complex relative permittivity in a range of from 2.0 to 10.0 in a frequency range of from 1 to 110 GHz and a minimum value of a dissipation factor of 0.35 or greater in the frequency range of from 1 to 110 GHz.

4 Claims, 1 Drawing Sheet

(A)  (B)

(A)  (B)

ELECTROMAGNETIC WAVE ABSORBER

FIELD OF THE INVENTION

This invention relates to an electromagnetic wave absorber particularly for an anechoic chamber for microwaves and millimeter waves

BACKGROUND OF THE INVENTION

Electromagnetic waves of various frequencies are emitted in an environment having many electromagnetic radiation sources, such as electronic equipment and communication equipment. It has been pointed out that the electromagnetic radiation from such equipment can cause neighboring devices to malfunction or the equipment itself can be caused to malfunction by any extraneous electromagnetic wave. Therefore, these types of equipment are required to have electromagnetic compatibility (hereinafter "EMC") from the design and development phase.

With the advent of ubiquitous era, electronic equipment and communication equipment using microwaves and millimeter waves are increasing, and use of low-frequency bands has been being shifted to use of high-frequency bands. Examples of equipment using a high frequency band include fourth generation mobile phones (5 to 6 GHz), ultrafast wireless LAN (60 GHz), and automotive millimeter wave radars (77 GHz). Use of microwaves and millimeter waves is also beginning to increase in broader fields including a microwave energy transmission test in aviation/space projects or a high-power emitting radar system used in military-related applications.

While most of the frequencies set out in standards relating to electromagnetic interference (EMI) have been up to 1 GHz, the tendency toward use of high frequencies in electronic equipment and communication equipment has recently extended the frequencies to be used to about 18 GHz. It is predicted that manufacturers are obliged to perform EMI measurement in a still higher frequency range before the coming of a full-scale ubiquitous society.

From the viewpoint of safety of anechoic chambers, electromagnetic wave absorbers (hereinafter referred to as "wave absorber(s)" or simply "absorber(s)") have recently come to be required to have incombustibility. In particular, an anechoic chamber in which high power is emitted as in the above described microwave energy transmission test or high power emitting radar system test, there is a possibility of a wave absorber producing heat on receipt of the radiation, suffering damage, and reducing its absorbing performance. It is also pointed out that an absorber can ignite, or a device being tested can produce heat and ignite to cause the absorber to catch fire.

From the background described, there is a need for a safe anechoic chamber for microrwaves and millimeter waves that allows EMC evaluation of a wide range of microwave and millimeter wave equipment from general electronic components to special high-power systems. Accordingly, there has been a demand for a wave absorbing material that exhibits excellent radiation absorbing performance in the microwave and millimeter wave range and withstands high power emission tests. A number of proposals have hitherto been made on wave absorbing materials.

For example, Japanese patent 4697829 proposes a carbon nanotube composite molded material composed of a matrix and carbon nanotubes aligned in the matrix along a given direction, the carbon nanotubes being uncovered with a ferromagnetic material. Compared with carbon nanotube composite material in which carbon nanotubes are randomly dispersed, the proposed material is described as having high electrical conductivity with a smaller amount of carbon nanotubes and, when applied to wave absorption, exhibits anisotropy and is therefore useful for wave absorption. However, it is difficult with the structure described in Japanese patent 4697829 to obtain excellent wave absorbing characteristics in the broad frequency band of microwaves and millimeter waves. According to Japanese patent 4697829, the contemplated matrix materials are organic materials, such as thermoplastic resins, curing resins, rubbers, and thermoplastic elastomers. It is unfeasible with such matrix materials to provide wave absorbers withstanding a high power emission test.

JP 2005-231931A discloses a cement-based wave absorber obtained by mixing flaky iron oxide particles having a predetermined average thickness and a predetermined minimum width in the main plane into an inorganic water settable material and molding the mixture into shape. The wave absorber is described as exhibiting stable absorption characteristics in a high frequency range of the order of gigahertz and being able to be designed to be thin and lightweight with a high dielectric constant and a high dielectric loss. The wave absorber is also described as being incombustible, free from deterioration by ultraviolet rays, and capable of withstanding long-term outdoor use.

Composed mainly of an inorganic material, the structure of the wave absorber of JP 2005-231931A is incombustible and excellent in power durability and is therefore preferred for use in high power emission tests. Nevertheless, because of the use of a magnetic material as a main component, the frequency band the wave absorber serves to absorb is limited to several tens of gigahertz. That is, the wave absorbent is incapable of achieving excellent wave absorbing performance over a broad microwave and millimeter wave range of from 1 to 110 GHz.

Thus, we have not yet acquired a wave absorber having excellent electromagnetic radiation absorbing characteristics in a broad microwave and millimeter wave range, incombustibility, and high power durability.

SUMMARY OF THE INVENTION

In the light of the above circumstances, an object of the invention is to provide a wave absorber having excellent wave absorbing characteristics in a broad microwave and millimeter wave range, incombustibility, and power durability.

With the above object in mind, the present inventors have found that a wave absorber having a controlled absolute value of the complex relative permittivity $[(\in'^2+\in''^2)^{0.5}]$ and a controlled dissipation factor (tan δ) in a frequency range of 1 to 110 GHz exhibits excellent wave absorption characteristics. The invention has been reached based on this finding. The invention provides a wave absorber containing cement and carbon nanotubes and having an absolute value of a complex relative permittivity $[(\in'^2+\in''^2)^{0.5}]$ in the range of from 2.0 to 10.0 in a frequency range of 1 to 110 GHz and a minimum value of a dissipation factor (tan δ) of 0.35 or greater in that frequency range.

The wave absorber of the invention exhibits excellent electrical conduction characteristics with a small amount of carbon based on ionic conduction by the ions present in the water in voids of the cement matrix and electrically conductive paths formed by a plurality of the carbon nanotubes, a wave absorbing material. In the cement matrix of the wave absorber there are electrically conductive paths that are electrically isolated from one another and each formed of a plurality of carbon nanotubes thereby to provide a resistor/capacitor (condenser) mixed structure exhibiting excellent dielectric characteristics based on resistance loss and dielectric loss. With respect to the wave absorption characteristics of a wave absorber, dielectric characteristics dominate in a frequency range of from several to several tens of gigahertz while electrical conduction characteristics dominate in a frequency range of from several tens to several hundreds of gigahertz. In the invention, the absolute value of the complex relative permittivity and the dissipation factor of the wave absorber in the frequency range of 1 to 110 GHz are adjusted to be in the above described respective ranges thereby to control the electrical conduction characteristics and the dielectric characteristics. As a result, excellent wave absorption characteristics in a broad frequency range of 1 to 110 GHz are achieved.

DETAILED DESCRIPTION OF THE INVENTION

Figure 1:
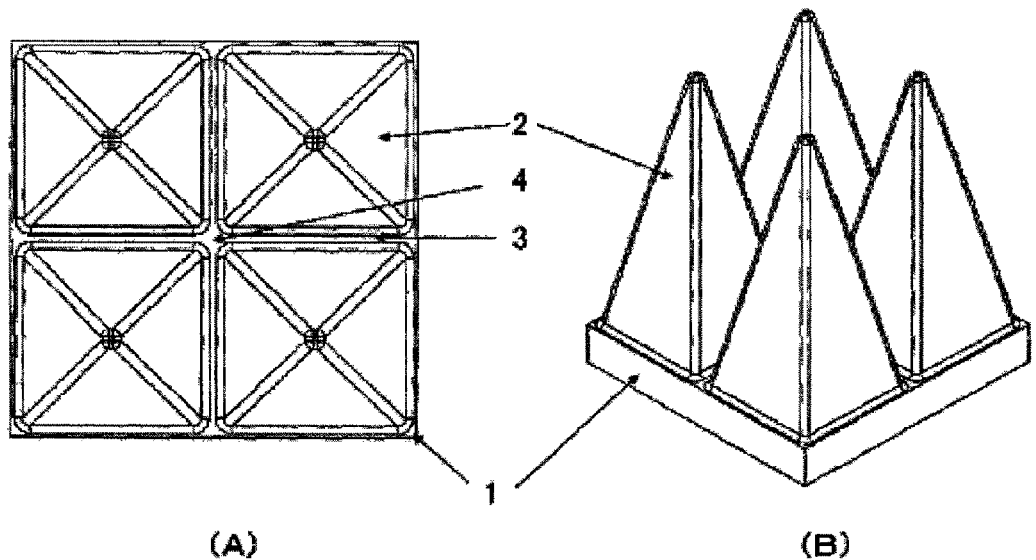
FIG. 1 represents an embodiment of the wave absorber according to the invention, in which the left image (A) is a top view, and the right image (B) is a perspective view.

The wave absorber of the invention is composed mainly of carbon nanotubes and cement.

In general, cement sets into a hard mass through a hydration reaction with water. The voids of the hard mass contain free water containing such ions as $Na^+$, $K^+$, $Ca^{2+}$, and $OH^-$. The presence of these ions develops electrical conductivity. Because carbon nanotubes are an electrically conductive fibrous material with high bulk density, they easily connect to one another to form electrically conductive paths in the matrix. For these reasons, the wave absorber of the invention exhibits excellent electrical conduction characteristics with a reduced amount of carbon nanotubes.

Since the amount of the carbon nanotubes is allowed to be reduced, electrically conductive paths formed by the connection of a plurality of carbon nanotubes are electrically insulated from one another by the cement matrix in the wave absorber of the invention. This configuration provides a mixed structure composed of a resistor and a capacitor (condenser) that stores electrical energy. Such a mixed structure develops resistance loss and dielectric loss, whereby excellent dielectric characteristics are obtained. Carbon nanotubes have per se a high aspect ratio, so that the connected nanotubes forming a conductive path has a much higher aspect ratio. As a result, each capacitor is capable of storing an increased amount of electrical energy to develop excellent dielectric characteristics.

With respect to the electromagnetic wave absorption characteristics of a wave absorber, dielectric characteristics dominate in a frequency range of from several to several tens of gigahertz while electrical conduction characteristics dominate in a frequency range of from several tens to several hundreds of gigahertz. The wave absorber of the invention, which contains cement and carbon nanotubes, is characterized by having an absolute value of a complex relative permittivity $[(\in'^2+\in''^2)^{0.5}]$ in the range of from 2.0 to 10.0 in a frequency range of 1 to 110 GHz and a minimum value of a dissipation factor (tan δ) of 0.35 or greater in the same frequency range. According to the above described structure, the wave absorber of the invention exhibits excellent wave absorption characteristics in a frequency range of several to several tens of gigahertz based on the dielectric characteristics derived from the resistance loss and dielectric loss of the cement/carbon nanotube composite. In a frequency range of several tens to several hundreds of gigahertz, on the other hand, the wave absorber exhibits excellent wave absorption characteristics based on the electrical conduction characteristics that are developed by the electrically conductive paths formed of the carbon nanotubes and ionic conduction by the ions present in the water in voids of the cement matrix. Thus, the wave absorber of the invention shows excellent wave absorption characteristics in a broad frequency range of from 1 to 110 GHz.

If the absolute value of the complex relative permittivity is less than 2.0, the wave absorber transmits electromagnetic waves therethrough with little absorption, resulting in a failure to provide sufficient wave absorbing performance in a desired frequency range. If it is more than 10.0, the absorber strongly reflects radiation waves, also resulting in a failure to exhibit sufficient wave absorbing performance in a desired frequency range. Even when the absolute value of the complex relative permittivity is in the range of from 2.0 to 10.0, if the minimum value of the dissipation factor is less than 0.35, the absorber does not sufficiently perform the function of absorbing electromagnetic radiation to convert the radiation energy to heat energy.

A carbon nanotube is formed of a network of carbon 6-membered rings called a graphene sheet wrapped into a single-walled cylinder or a concentric multi-walled cylinder. A carbon nanotube is known to have a high aspect ratio usually with a diameter of several to several tens of nanometers and a length of several micrometers. A carbon nanotube has a high bulk density and exhibits, in the form of a single fiber, higher thermal and electrical conductivity than other carbon materials. In order to obtain better electrical conduction characteristics and dielectric characteristics, it is desirable that the carbon tubes be ready to form electrically conductive paths to provide capacitors capable of storing a good amount of electrical energy. More specifically, it is preferred for the individual carbon nanotubes to have a length of 1 to 20 μm. With a length less than 1 μm, the nanotubes may have difficulty in connecting to each other to form an electrical path, and it is likely that sufficient electrical conduction characteristics are not achieved with a small amount of nanotubes. With a length exceeding 20 μm, the nanotubes are liable to become entangled with one another to reduce their dispersibility, and it is likely that sufficient electrical conduction characteristics are not developed with a small amount of nanotubes. Graphite and carbon black, which are conventional carbon materials, have difficulty in forming electrically conductive paths because of their particulate form and have a small capacity for storing electrical energy as a capacitor because of their low aspect ratio.

The content of the carbon nanofibers relative to the total mass of the absorber is preferably 1 mass % or more, more preferably 2 to 10 mass %. At this content, it is easier for the nanofibers to form electrical paths to show further improved wave absorbing performance in the frequency range of several tens to several hundreds of gigahertz in which electrical conduction characteristics are dominant. Moreover, at that content of carbon nanotubes, the carbon nanotubes connect to each other to an appropriate length to provide an electrically conductive path with an increased aspect ratio. This results in improved function as a capacitor and further improved wave absorbing performance in the frequency range of several to several tens of gigahertz in which the dielectric characteristics are dominant.

When the carbon nanotube content is less than 1 mass %, electrically conductive paths are not formed by the carbon nanotubes well enough to exhibit sufficient electrical conduction characteristics, so that the wave absorber can fail to provide satisfactory wave absorbing performance in the frequency range of from several tens to several hundreds of gigahertz in which electrical conduction characteristics are dominant. Furthermore, the connection of the carbon nanotubes dispersed in the cement matrix is apt to be too small to exhibit sufficient dielectric characteristics, so that the absorber can also fail to achieve satisfactory wave absorbing performance in the frequency range of from several to several tens of gigahertz in which dielectric characteristics are dominant.

On the other hand, if the carbon nanotube content is more than 10 mass %, it is likely that electrically conductive paths are formed almost throughout the absorber, resulting in a failure to provide resistors and capacitors in the absorber. As a result, satisfactory wave absorbing performance may not be achieved in the frequency range of from several to several tens of gigahertz in which dielectric characteristics are dominant. Besides, the wave absorber can have a high carbon concentration on its surface, tending to allow electromagnetic waves to reflect without being absorbed, which can result in reduction of wave absorbing performance. Additionally, to use a larger amount of carbon nanotubes than needed is uneconomical.

The carbon nanotube that can be used in the invention may be either hollow or solid. Hollow carbon nanotubes include single-walled carbon nanotubes (SWNTs) and multi-walled carbon nanotubes (MWNTs). Commercially available carbon nanotubes that can be used in the invention include VGCF and VGCF-H both from Showa Denko K.K. and Flo Tube 9000 from CNano Technology, Ltd.

Containing cement as a matrix, the wave absorber of the invention is incombustible, power-durable, and capable of withstanding electromagnetic field immunity tests. Since cement sets to harden through a hydration reaction with water, a molded article is obtained without sintering at 1000° C. or higher as is required for ceramic materials, such as alumina and zirconia. Therefore, problems associated with sintering, such as dimensional variations due to shrinkage and combustion of carbon nanotubes, are not involved.

The cement that is used as a matrix of the wave absorber of the invention is not particularly limited and may be either hydraulic or air-hardening. Examples of the hydraulic cement include various types of portland cement (e.g., normal, high-early-strength, and low-heat portland cement), mixed cement (e.g., portland blast-furnace slag cement or portland fly ash cement), and alumina cement. Examples of the air-hardening cement include gypsum magnesia cement, lime, and magnesian lime. Any of these cements sets on hydration reaction with water to give a hardened mass of which the voids contain residual water containing ions, such as $Na^+$, $K^+$, $Ca^{2+}$, and $OH^-$. These ions serving to carry electricity, the hardened cement mass per se is electrically conductive. Therefore, the amount of the carbon nanotubes to be added can be reduced so as to increase the ratio of the cement thereby to improve the strength of the wave absorber. While either of hydraulic cement and air-hardening cement may be used as stated, hydraulic cement that is resistant to moisture is preferred taking outdoor use into account. Gravel, glass fiber, and so on may be added to the cement to increase the matrix strength.

The method for making the wave absorber of the invention is not particularly limited. The wave absorber is usually produced by mixing carbon nanotubes and a dispersing medium, such as water, into a cement raw material, followed by stirring to prepare a slurry, pouring the resulting cement slurry into a mold, curing the cement for a prescribed time at controlled temperature and humidity in accordance with the curing conditions of the cement to harden the cement, and removing the hardened mass from the mold.

Figure 2:
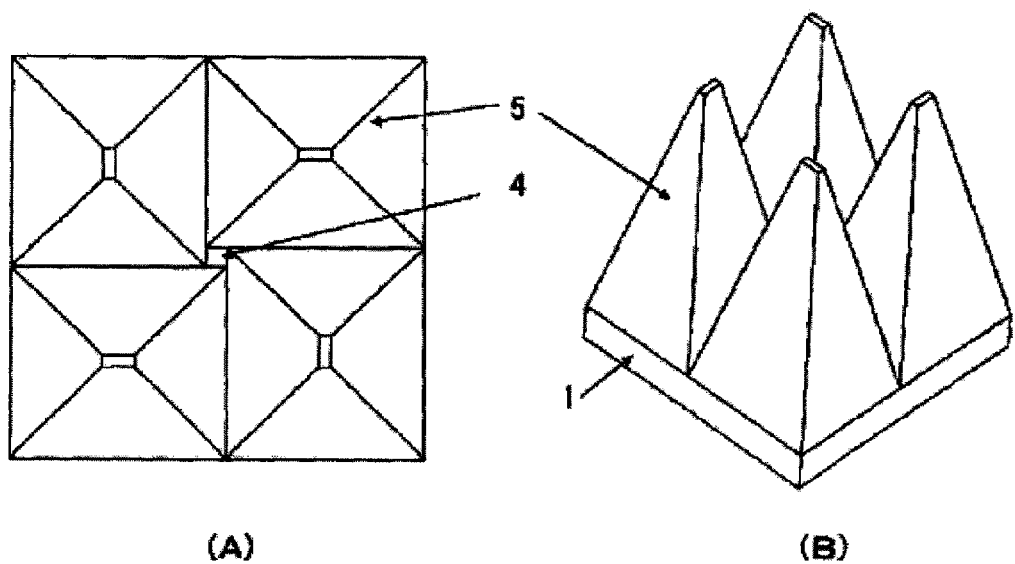
FIG. 2 represents another embodiment of the wave absorber according to the invention, in which the left image (A) is a top view, and the right image (B) is a perspective view.

While the wave absorber of the invention is not particularly limited in shape, it is preferably shaped such that the volume proportion of the absorber per unit spatial volume increases from the end of its electromagnetic wave-receiving side toward the opposite end. Such a shape is exemplified by a wedge, a pyramidal, and a conical shape. A wedge shape and a rectangular pyramid as illustrated in FIG. 1, are preferred. As shown in FIG. 1, the wave absorber may be composed of a plate-shaped part 1 and a plurality of rectangular pyramidal parts 2 arranged on the plate-shaped part 1 in a grid (two per direction in the embodiment of FIG. 1). The absorber so configured has good isotropy and exhibits satisfactory wave absorption characteristics in a broad frequency range of interest. The absorber having the geometry of FIG. 1 may commonly have a certain space (gap) 3 between adjacent pyramidal parts 2 and a flat portion 4 at the center thereof where an anchor fastener is to be fixed. As illustrated in FIG. 2, the wave absorber may have a geometry composed of oblong rectangular pyramidal (or wedge-shaped, having an oblong rectangular base) parts 5 arranged with a longer side of the rectangular base of one pyramid adjoining with a shorter side of the rectangular base of an adjacent pyramid. According to this arrangement, the rectangular pyramidal parts 5 are arranged with no spacing between their bases while providing a flat square portion 4 where an anchor fastener is to be fixed. According to this geometry, because reflection of electromagnetic radiation on flat spaces between pyramidal parts is minimized, there is provided a wave absorber of smaller size and yet capable of effectively absorbing electromagnetic waves of a broader range of frequency. In addition, in the case of the rectangular pyramidal parts shown in FIG. 2, since the inclination angle to the base differs between adjacent faces, the absorber exhibits excellent absorbing performance for oblique incidence of electromagnetic waves.

EXAMPLES

The invention will now be illustrated in more detail with reference to Examples, it being understood that the following description is illustrative and not restrictive of the scope of the invention. Unless otherwise noted, all the percents and parts are by mass.

Example 1

As shown in Table 1, 30 parts of water and 2.0 parts (2.0% relative to the total mass of the wave absorber obtained) of carbon nanotubes having a length of 5 μm were added to 100 parts of portland cement, followed by kneading along with a dispersant to prepare a slurry. The slurry was cast in a mold and hardened at room temperature to give a molded block (wave absorber) having the shape illustrated in FIG. 1 in which four square pyramids (two per direction) measuring 50 mm along each side of the base with a height of 180 mm were arranged in a grid on a plate measuring 100 mm×100 mm×15 mm (thickness). A total of 36 wave absorbers were made in that way and arrayed in a grid extending 600 mm by 600 mm. The electromagnetic radiation absorbing performance of the array of the absorbers was evaluated by the method described infra. The absolute value of the complex relative permittivity of the resulting absorber in the frequency range of 1 to 110 GHz was 3.0 to 4.0, and the minimum value of the dissipation factor (tan δ) of the absorber in the same frequency range was 0.5 (see Table 2). The absolute value of the complex relative permittivity and the dissipation factor (tan δ) were determined by the coaxial waveguide method (for a frequency band of 1 to 18 GHz), the rectangular waveguide method (for a frequency band of 18 to 40 GHz), and the free space method for S parameter measurement (for a frequency band of 40 to 110 GHz).

Example 2

Wave absorbers were made and evaluated in the same manner as in Example 1, except for increasing the carbon nanotube content relative to the total mass of the absorber from 2% to 10% as shown in Table 1. The resulting absorber had an absolute value of the complex relative permittivity of 7.0 to 10.0 and a minimum dissipation factor of 0.75 in the frequency range of 1 to 110 GHz (see Table 2).

Example 3

Wave absorbers were made and evaluated in the same manner as in Example 1, except for changing the carbon nanotube length from 5 μm to 1 μm as shown in Table 1. The resulting absorber had an absolute value of the complex relative permittivity of 2.0 to 3.5 and a minimum dissipation factor of 0.4 in the frequency range of 1 to 110 GHz (see Table 2).

Example 4

Wave absorbers were made and evaluated in the same manner as in Example 1, except for changing the carbon nanotube length from 5 μm to 20 μm as shown in Table 1. The resulting absorber had an absolute value of the complex relative permittivity of 2.0 to 3.5 and a minimum dissipation factor of 0.45 in the frequency range of 1 to 110 GHz (see Table 2).

Example 5

Wave absorbers were made and evaluated in the same manner as in Example 1, except for replacing portland cement as a matrix material with alumina cement as shown in Table 1. The resulting absorber had an absolute value of the complex relative permittivity of 3.0 to 4.0 and a minimum dissipation factor of 0.5 in the frequency range of 1 to 110 GHz (see Table 2).

Example 6

Wave absorbers were made and evaluated in the same manner as in Example 1, except for replacing portland cement as a matrix material with gypsum magnesia cement as shown in Table 1. The resulting absorber had an absolute value of the complex relative permittivity of 3.0 to 4.0 and a minimum dissipation factor of 0.5 in the frequency range of 1 to 110 GHz (see Table 2).

Comparative Example 1

Wave absorbers were made and evaluated in the same manner as in Example 1, except for replacing carbon nanotubes as an absorbing material with graphite as shown in Table 1. The resulting absorber had an absolute value of the complex relative permittivity of 2.0 to 3.0 and a minimum dissipation factor of 0.1 in the frequency range of 1 to 110 GHz (see Table 2).

Comparative Example 2

Wave absorbers were made and evaluated in the same manner as in Example 1, except for changing the carbon nanotube content relative to the total mass of the absorber from 2% to 0.5% as shown in Table 1. The resulting absorber had an absolute value of the complex relative permittivity of 1.0 to 3.0 and a minimum dissipation factor of 0.2 in the frequency range of 1 to 110 GHz (see Table 2).

Comparative Example 3

Wave absorbers were made and evaluated in the same manner as in Example 1, except for changing the carbon nanotube content relative to the total mass of the absorber from 2% to 20% as shown in Table 1. The resulting absorber had an absolute value of the complex relative permittivity of 3.0 to 18.0 and a minimum dissipation factor of 0.45 in the frequency range of 1 to 110 GHz (see Table 2).

Comparative Example 4

Wave absorbers were made and evaluated in the same manner as in Example 1, except for changing the carbon nanotube length from 5 μm to 0.5 μm as shown in Table 1. The resulting absorber had an absolute value of the complex relative permittivity of 2.0 to 4.0 and a minimum dissipation factor of 0.15 in the frequency range of 1 to 110 GHz (see Table 2).

Comparative Example 5

Wave absorbers were made and evaluated in the same manner as in Example 1, except for changing the carbon nanotube length from 5 μm to 25 μm as shown in Table 1. The resulting absorber had an absolute value of the complex relative permittivity of 2.0 to 4.0 and a minimum dissipation factor of 0.2 in the frequency range of 1 to 110 GHz (see Table 2).

Evaluation of Electromagnetic Radiation Absorption Characteristics:

In evaluating the electromagnetic radiation absorption characteristics of the wave absorbers obtained in Examples 1 to 6 and Comparative Examples 1 to 5, electromagnetic radiation emitted from a horn antenna was collimated into plane waves by a dielectric lens so as to be directed perpendicularly to the absorbers. The results of evaluation are shown in Table 2. The measuring frequency range was from 1 to 110 GHz.

It is seen from the results in Table 2 that the absorber of Comparative Example 1 using graphite as an absorbing material has the absolute value of the complex relative permittivity of 2.0 to 3.0 in the frequency range of 1 to 110 GHz but has the minimum dissipation factor as low as 0.1 in that frequency range and is unable to provide sufficient radiation absorbing performance. This is believed to be because graphite, a particulate carbon material, hardly forms electrically conductive paths with themselves and fails to provide sufficient electrical conduction characteristics at a content of 2% and also because the graphite/cement composite does not produce the effect of dielectric loss of capacitor function.

In contrast, the absorber of Example 1 using carbon nanotubes as an absorbing material has an absolute value of the complex relative permittivity of 3.0 to 4.0 and a minimum value of the dissipation factor increased to 0.5 in the frequency range of 1 to 110 GHz and proves to achieve excellent radiation absorbing performance of 25 dB or more over the entire measuring frequency range of from 1 to 110 GHz. In Example 2 where the carbon nanotube content was increased over that of Example 1, both the absolute value of the complex relative permittivity and the minimum dissipation factor in the frequency range of 1 to 110 GHz increased to 7.0 to 10.0 and 0.75, respectively, and the absorber of Example 1 proved more excellent than the absorber of Example 1 in radiation absorbing performance over the entire frequency range of 1 to 110 GHz. In Comparative Example 2 where the carbon nanotube content was reduced from that in Example 1, the absolute value of the complex relative permittivity was 1.0 to 3.0, the minimum value of the dissipation factory decreased to 0.2, and the radiation absorbing performance over the entire frequency range of 1 to 110 GHz reduced as compared with Example 1 (in particular, the radiation absorption performance in a frequency range of 5 GHz or lower was less than 20 dB). This is believed to be because the carbon nanotube content is so small that the formation of electrically conductive paths and the capacitor function are insufficient.

In comparative Example 3 where the carbon nanotube content was further increased from that of Example 2, the minimum dissipation factor was 0.45 but the absolute value of the complex relative permittivity was 3 to 18, which is higher than the range specified in the invention. The absorber of Comparative Example 3 exhibited excellent radiation absorption characteristics in the high frequency range of 5 GHz or higher but failed to have sufficient radiation absorbing performance in the frequency band of 1 to 3 GHz. These results appear to be because the carbon nanotubes added in an increased amount form electrically conductive paths throughout the absorber, and, as a result, while excellent radiation absorption characteristics are obtained in the high frequency range where electrical conduction characteristics are dominant, radiation absorption characteristics are not obtained in the low frequency range where dielectric characteristics are dominant on account of the failure to form resistors and capacitors in the absorber.

The absorbers of Examples 3 and 4 containing carbon nanotubes with a reduced length and an increased length, respectively, as compared with those used in Example 1 both proved to have excellent radiation absorption performance in the entire frequency range of interest. In Examples 3 and 4, the absolute value of complex relative permittivity $[(\in'^2 + \in''^2)^{0.5}]$ in the frequency range of 1 to 110 GHz was in the range of from 2.0 to 10.0, and the minimum value of the dissipation factor (tan δ) in the same frequency range was 0.35 or greater. In Comparative Examples 4 and 5 in which the length of the carbon nanotubes was further reduced and increased, respectively, the minimum value of the dissipation factor (tan δ) in the frequency range of interest was less than 0.35, which is out of the range specified in the invention, and the absorbers failed to provide sufficient radiation absorption characteristics in the frequency range of 3 GHz or lower.

It was also proved that the absorbers of Examples 5 and 6 in which the portland cement as a matrix material was replaced with alumina cement and gypsum magnesia cement, respectively, had both the absolute value of the complex relative permittivity and the minimum value of the dissipation factor (tan δ) in the frequency range of 1 to 110 GHz falling within the respective ranges of the invention and exhibited excellent radiation absorbing performance similarly to the absorber of Example 1.

It was thus confirmed from all these results that a wave absorber made of cement and carbon nanotubes and having an absolute value of the complex relative permittivity $[(\in'^2 + \in''^2)^{0.5}]$ in the range of from 2.0 to 10.0 in a frequency range of 1 to 110 GHz and a minimum value of the dissipation factor (tan δ) of 0.35 or greater in the same frequency range exhibits excellent radiation absorption characteristics in a broad frequency range of 1 to 110 GHz.

TABLE 1

| | Electromagnetic Radiation Absorbing Material | | | |
| --- | --- | --- | --- | --- |
| | | Additive | | |
| | Matrix Material | Kind | Amount (%) | Length (μm) |
| Example 1 | portland cement | carbon nanotube | 2 | 5 |
| Example 2 | portland cement | carbon nanotube | 10 | 5 |
| Example 3 | portland cement | carbon nanotube | 2 | 1 |
| Example 4 | portland cement | carbon nanotube | 2 | 20 |
| Example 5 | alumina cement | carbon nanotube | 2 | 5 |
| Example 6 | gypsum magnesia cement | carbon nanotube | 2 | 5 |
| Comparative Example 1 | portland cement | graphite | 2 | — |
| Comparative Example 2 | portland cement | carbon nanotube | 0.5 | 5 |
| Comparative Example 3 | portland cement | carbon nanotube | 20 | 5 |
| Comparative Example 4 | portland cement | carbon nanotube | 2 | 0.5 |
| Comparative Example 5 | portland cement | carbon nanotube | 2 | 25 |

TABLE 2

| | 1-110 GHz | | Electromagnetic Radiation Absorption Characteristics (dB) | | | | | | | | | |
|---|---|---|---|---|---|---|---|---|---|---|---|---|
| | \|Complex Relative Permittivity\| | Dissipation Factor (Min.) | 1 GHz | 3 GHz | 5 GHz | 10 GHz | 20 GHz | 40 GHz | 60 GHz | 80 GHz | 100 GHz | 110 GHz |
| Example 1 | 3.0 to 4.0 | 0.5 | 25 | 30 | 30 | 35 | 40 | 45 | 50 | 50 | 50 | 50 |
| Example 2 | 7.0 to 10.0 | 0.75 | 30 | 35 | 40 | 45 | 50 | 55 | 60 | 60 | 60 | 60 |
| Example 3 | 2.0 to 3.5 | 0.4 | 22 | 25 | 30 | 32 | 35 | 40 | 40 | 40 | 40 | 40 |
| Example 4 | 2.0 to 3.5 | 0.45 | 23 | 25 | 27 | 30 | 35 | 40 | 45 | 45 | 50 | 50 |
| Example 5 | 3.0 to 4.0 | 0.5 | 25 | 30 | 30 | 35 | 40 | 45 | 50 | 50 | 50 | 50 |
| Example 6 | 3.0 to 4.0 | 0.5 | 25 | 30 | 30 | 35 | 40 | 45 | 50 | 50 | 50 | 50 |
| Comparative Example 1 | 2.0 to 3.0 | 0.1 | 5 | 10 | 10 | 15 | 15 | 10 | 10 | 10 | 10 | 10 |
| Comparative Example 2 | 1.0 to 3.0 | 0.2 | 10 | 15 | 18 | 20 | 25 | 25 | 25 | 25 | 25 | 25 |
| Comparative Example 3 | 3.0 to 18.0 | 0.45 | 15 | 18 | 30 | 35 | 40 | 45 | 50 | 55 | 60 | 65 |
| Comparative Example 4 | 2.0 to 4.0 | 0.15 | 15 | 18 | 23 | 25 | 25 | 30 | 32 | 35 | 35 | 30 |
| Comparative Example 5 | 2.0 to 4.0 | 0.2 | 15 | 18 | 20 | 23 | 30 | 30 | 35 | 35 | 40 | 40 |

What is claimed is:

1. An electromagnetic wave absorber comprising cement and carbon nanotubes and having an absolute value of a complex relative permittivity in a range of from 2.0 to 10.0 in a frequency range of from 1 to 110 GHz and a minimum value of a dissipation factor of 0.35 or greater in the frequency range of from 1 to 110 GHz.

2. The electromagnetic wave absorber according to claim 1, wherein an amount of the carbon nanotubes is from 2% to 10% by mass relative to a total mass of the absorber.

3. The electromagnetic wave absorber according to claim 1, wherein the carbon nanotubes each have a length of from 1 to 20 μm.

4. The electromagnetic wave absorber according to claim 2, wherein the carbon nanotubes each have a length of from 1 to 20 μm.

* * * * *